US012696377B2

(12) United States Patent
Zheng et al.

(10) Patent No.: US 12,696,377 B2
(45) Date of Patent: Jul. 28, 2026

(54) DISPLAY MODULE AND DISPLAY APPARATUS WITH GROUNDING STRUCTURE

(71) Applicants:Xiamen Tianma Optoelectronics Co., Ltd., Xiamen (CN); Xiamen Tianma Microelectronics Co., Ltd., Xiamen (CN)

(72) Inventors: Ningyang Zheng, Xiamen (CN); Sihan Qiu, Xiamen (CN); Xuhui Peng, Xiamen (CN); Chengxu Ma, Xiamen (CN); Pengbo Li, Xiamen (CN)

(73) Assignees: Xiamen Tianma Optoelectronics Co., Ltd., Xiamen (CN); Xiamen Tianma Microelectronics Co., Ltd., Xiamen (CN)

( * ) Notice: Subject to any disclaimer, the term of this patent is extended or adjusted under 35 U.S.C. 154(b) by 271 days.

(21) Appl. No.: 18/649,021

(22) Filed: Apr. 29, 2024

(65) Prior Publication Data

US 2024/0284589 A1 Aug. 22, 2024

(30) Foreign Application Priority Data

Dec. 19, 2023 (CN) .......................... 202311764840.0

(51) Int. Cl.
  H05K 1/189 (2026.01)
  H05K 1/02 (2006.01)
  H05K 3/36 (2006.01)
(52) U.S. Cl.
  CPC ........... H05K 1/0215 (2013.01); H05K 1/189 (2013.01); H05K 3/363 (2013.01); H05K 2201/10128 (2013.01)

(58) Field of Classification Search
  CPC ......... H05K 2201/10128; H05K 1/189; H05K 3/363; H05K 1/0215; G02F 2202/22; G02F 1/1333; G02F 1/13452
  (Continued)

(56) References Cited

U.S. PATENT DOCUMENTS 6,525,786 B1 * 2/2003 Ono .................... G02F 1/13452
                                              349/40
11,064,622 B2 * 7/2021 Chen .................... H05K 1/0215
  (Continued)

FOREIGN PATENT DOCUMENTS

CN        201623942 U      11/2010
CN        102892251 A       1/2013
CN        215819100 U       2/2022

OTHER PUBLICATIONS

Chinese Office Action mailed on Apr. 24, 2026 in Chinese App. No. 202311764840.0; 14 pages.

*Primary Examiner* — Timothy J Thompson
*Assistant Examiner* — Michael F Mcallister
(74) *Attorney, Agent, or Firm* — CHRISTENSEN O'CONNOR JOHNSON KINDNESS PLLC

(57) ABSTRACT

A display module and a display apparatus are described. The display module includes display panel, backplane, and printed circuit board electrically connected to display panel. The backplane includes body and tongue protruding from body. The printed circuit board is fixed to tongue and includes first grounding region and second grounding region. The first grounding region is located on a side of the printed circuit board adjacent to the tongue. The tongue includes a first surface and a second surface opposite to the first surface. The first surface faces a side of the printed circuit board, and the first grounding region is electrically connected to the first surface of the tongue. The second grounding region is electrically connected to the second (Continued)

surface of the tongue and/or the body of the backplane. The printed circuit board is better fixed. A grounding impedance of the printed circuit board is reduced and meets requirements.

15 Claims, 15 Drawing Sheets

(58) Field of Classification Search
USPC .......................................................... 361/749
See application file for complete search history.

(56) References Cited

U.S. PATENT DOCUMENTS

2021/0048923 A1* 2/2021 Niwa .................... G06F 1/1643
2022/0357615 A1* 11/2022 Miyao ............... G02F 1/136286

* cited by examiner

01

Y

X

01

01

01

01

01

01

01

01

02

01

DISPLAY MODULE AND DISPLAY APPARATUS WITH GROUNDING STRUCTURE

CROSS-REFERENCE TO RELATED DISCLOSURE

The present disclosure claims priority to Chinese Patent Application No. 202311764840.0, filed on Dec. 19, 2023, the content of which is incorporated herein by reference in its entirety.

TECHNICAL FIELD

The present disclosure relates to the display field, and in particular, to a display module and a display apparatus.

BACKGROUND

Liquid crystal display apparatuses have been widely used because of their low energy consumption, low radiation, small volume and weight, and the like. In a liquid crystal display apparatus, a printed circuit board is typically fixed to a tongue of a backplane.

Conventionally, the printed circuit fixed to the tongue has a large grounding impedance, causing a poor grounding effect.

SUMMARY

According to one aspect of the present disclosure, a display module is provided. In an embodiment, the display module includes: a display panel, a backplane, and a printed circuit board. In an embodiment, the printed circuit board is electrically connected to the display panel. In an embodiment, the backplane includes a body and a tongue protruding from the body, and the printed circuit board is fixed to the tongue. In an embodiment, the printed circuit board includes a first grounding region and a second grounding region. In an embodiment, the first grounding region is located on a side of the printed circuit board adjacent to the tongue. In an embodiment, the tongue includes a first surface and a second surface opposite to the first surface. In an embodiment, the first surface faces a side of the printed circuit board, and the first grounding region is electrically connected to the first surface of the tongue. In an embodiment, the second grounding region is electrically connected to at least one of the second surface of the tongue or the body of the backplane.

According to another aspect of the present disclosure, a display apparatus is provided. The display apparatus includes a display module. In an embodiment, the display module includes: a display panel, a backplane, and a printed circuit board. In an embodiment, the printed circuit board is electrically connected to the display panel. In an embodiment, the backplane includes a body and a tongue protruding from the body, and the printed circuit board is fixed to the tongue. In an embodiment, the printed circuit board includes a first grounding region and a second grounding region. In an embodiment, the first grounding region is located on a side of the printed circuit board adjacent to the tongue. In an embodiment, the tongue includes a first surface and a second surface opposite to the first surface. In an embodiment, the first surface faces a side of the printed circuit board, and the first grounding region is electrically connected to the first surface of the tongue. In an embodiment, the second grounding region is electrically connected to at least one of the second surface of the tongue or the body of the backplane.

In embodiments of the present disclosure, the first grounding region of the printed circuit board is electrically connected to the first surface of the tongue, and the second grounding region of the printed circuit board is electrically connected to the second surface of the tongue and/or the body of the backplane. In this way, the first grounding region of the printed circuit board and the first surface of the tongue form a conductive path for electrostatic discharge, and the second grounding region of the printed circuit board and the second surface of the tongue and/or the body of the backplane form another conductive path for electrostatic discharge. A fixing point of the printed circuit board is increased. The electrostatic discharge path of the printed circuit board is also increased. A grounding impedance of the printed circuit board is reduced. Therefore, the fixing of the printed circuit board is improved, and the grounding impedance of the printed circuit board meets requirements.

DRAWINGS

In order to more clearly illustrate the technical solutions in the embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art from the provided drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "and/or" used herein merely indicates a relationship describing associated objects, indicating three possible relationships. For example, the expression "A and/or B" indicates: A exists alone, both A and B exist, or B exists alone. In addition, the character "/" in this description generally means that the associated objects are in an "or" relationship.

In this specification, it should be understood that the terms "basically", "approximately", "roughly", "about", "generally" and "substantially" described in the claims and embodiments of this disclosure refer to a reasonable process operation range or tolerance range, which can be substantially agreed, rather than an exact value.

It should be understood that although the terms 'first', 'second' and 'third' are used in the present disclosure to describe surfaces, grounded regions, conductive adhesives and the like, these surfaces, grounded regions, conductive adhesives should not be limited to these terms. These terms are used only to distinguish surfaces from each other, distinguish grounded regions from each other, and distinguish conductive adhesives from each other. For example, without departing from the scope of the embodiments of the present disclosure, a first surface can also be referred to as a second surface. Similarly, the second surface can also be referred to as the first surface.

The applicant provided a solution to the problems existing in the prior art through careful and in-depth research.

Figure 1:
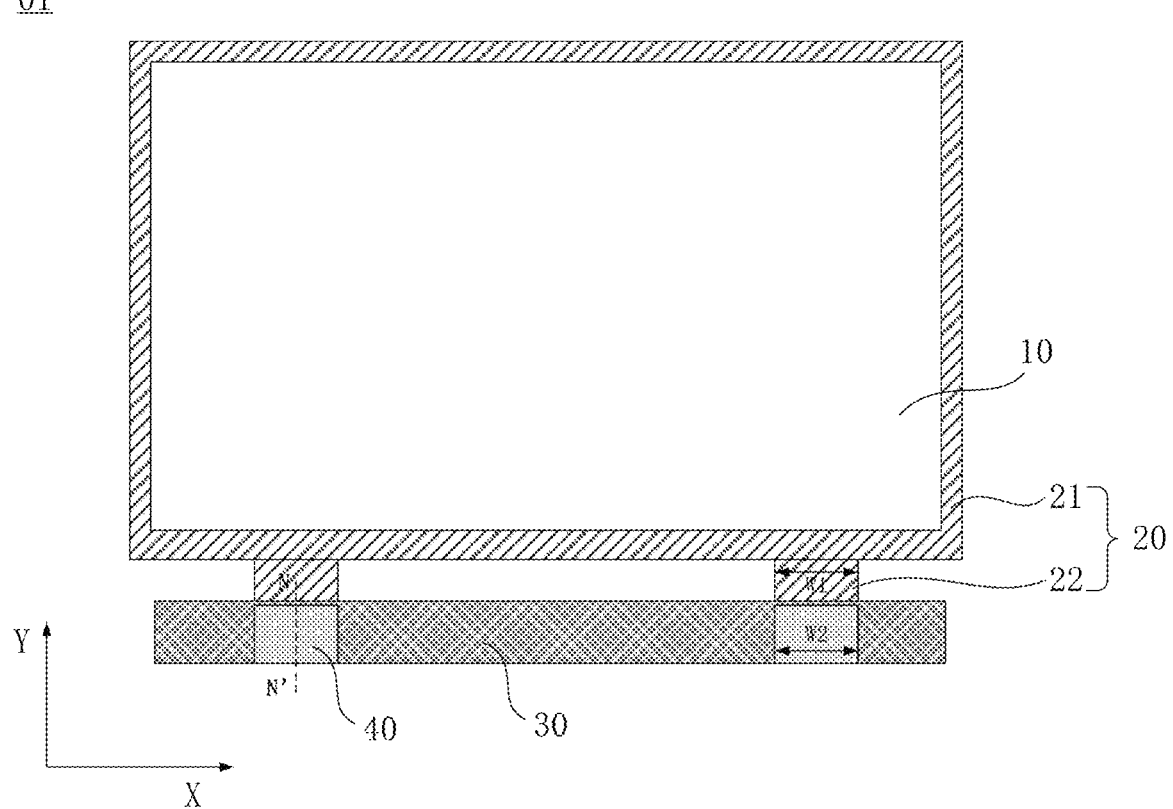
FIG. 1 is a plan view of a display module according to some embodiments of the present disclosure.
Figure 2:
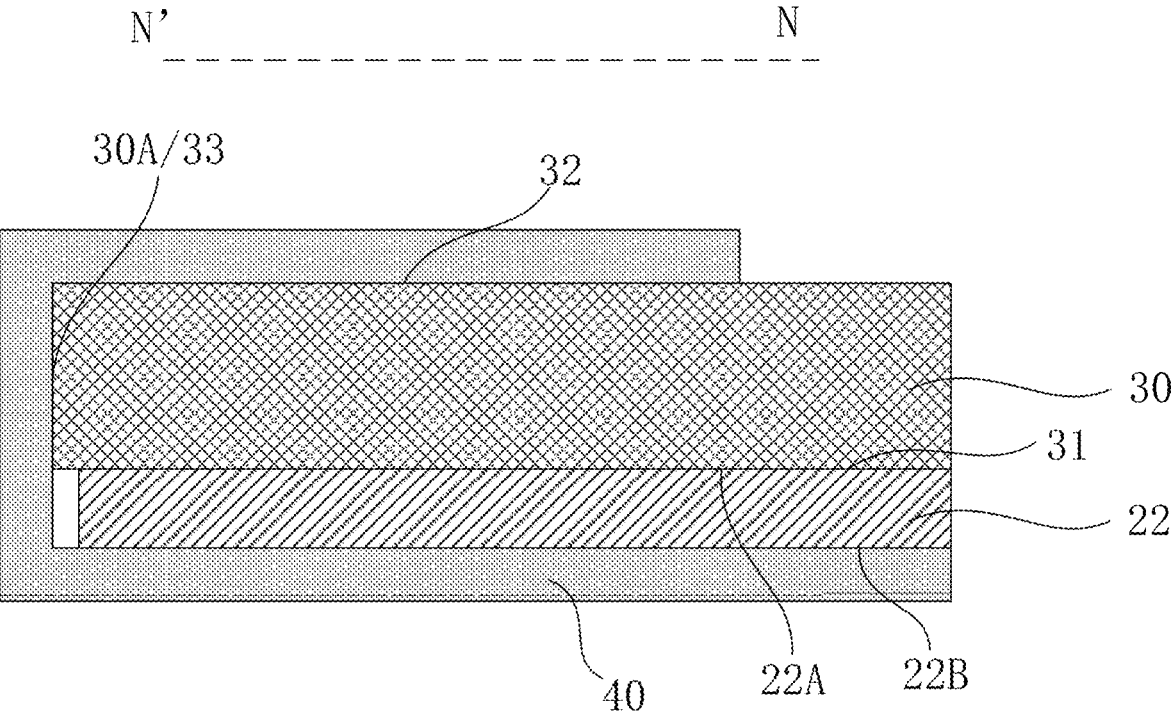
FIG. 2 is a cross-sectional view of a display module taken along line NN' in FIG. 1 according to some embodiments of the present disclosure.

FIG. 1 is a plan view of a display module according to some embodiments of the present disclosure. FIG. 2 is a cross-sectional view of a display module taken along line NN' in FIG. 1 according to some embodiments of the present disclosure.

Embodiments of the present disclosure provide a display module 01. As shown in FIG. 1, the display module 01 includes a display panel 10, a backplane 20, and a printed circuit board 30. The printed circuit board 30 is electrically connected to the display panel 10 and supplies a display signal to the display panel 10. The electrical connection between the display panel 10 and the printed circuit board 30 is not shown in the figure.

The backplane 20 includes a body 21 and a tongue 22 protruding from the body 21. The body 21 supports the display panel 10. The printed circuit board 30 is fixed to the tongue 22. The backplane 20 includes a metal material. In addition to fixing the printed circuit board 30, the backplane 20 may serve as a grounding terminal for electrostatic discharging of the printed circuit board 30, thereby preventing the normal operation of the printed circuit board 30 from being affected by static electricity.

As shown in FIG. 2, the printed circuit board 30 includes a first grounding region 31. The first grounding region 31 is located on a side of the printed circuit board 30 adjacent to the tongue 22. The first grounding region 31 may be a region of the printed circuit board 30 where metal material is exposed. The tongue 22 includes a first surface 22A and a second surface 22B opposite to the first surface 22A. The first surface 22A is located on a side of the tongue 22 adjacent to the printed circuit board 30. The first grounding region 31 and the first surface 22A of the tongue 22 are electrically connected. The static electricity on the printed circuit board 30 may be discharged via a conductive path formed by the first grounding region 31 and the tongue 22.

The printed circuit board 30 may further include a second grounding region 32. The second grounding region 32 may be another region of the printed circuit board 30 where metal material is exposed. The second grounding region 32 is electrically connected to the second surface 22B of the tongue 22 and/or the body 21 of the backplane 20.

In this regard, as shown in FIG. 2, the second grounding region 32 may be electrically connected to the second surface 22B of the tongue 22, or the second grounding region 32 may be electrically connected to the body 21 of the backplane 20, or the second grounding region 32 is electrically connected to both the second surface 22B of the tongue 22 and the body 21 of the backplane 20.

It should be noted that the position of the second grounding region 32 on the printed circuit board 30 if the second grounding region 32 is electrically connected to the second surface 22B of the tongue 22 may be different from the position of the second grounding region 32 on the printed circuit board 30 if the second grounding region 32 is electrically connected to the body 21 of the backplane 20. In this way, the electrical connection between the second grounding region 32 and the second surface 22B of the tongue 22 or the body 21 of the backplane 20 is convenient.

Certainly, if the second grounding region 32 is electrically connected to both the second surface 22B of the tongue 22 and the body 21 of the backplane 20, a same second grounding region 32 is electrically connected to both the second surface 22B of the tongue 22 and the body 21 of the backplane 20, or second grounding regions 32 at different positions are electrically connected to the second surface 22B of the tongue 22 and the body 21 of the backplane 20, respectively.

In embodiments of the present disclosure, the first grounding region 31 of the printed circuit board 30 is electrically connected to the first surface 22A of the tongue 22, and the second grounding region 32 of the printed circuit board 30 is electrically connected to the second surface 22B of the tongue 22 and/or the body 21 of the backplane 20. In this way, the first grounding region 31 of the printed circuit board 30 and the first surface 22A of the tongue 22 may form a conductive path for electrostatic discharge, and the second grounding region 32 of the printed circuit board 30 and the second surface 22B of the tongue 22 and/or the body 21 of the backplane 20 may form another conductive path for electrostatic discharge. Therefore, the number of fixing points of the printed circuit board 30 is increased, and the number of electrostatic discharge paths of the printed circuit board 30 is also increased, thereby reducing a grounding impedance of the printed circuit board 30. Accordingly, the fixing of the printed circuit board 30 is improved, and the grounding impedance of the printed circuit board 30 meets requirements.

In some embodiments of the present disclosure, as shown in FIG. 1 and FIG. 2, the second grounding region 32 is located on a side of the printed circuit board 30 away from the tongue 22. That is, the second grounding region 32 and the first grounding region 31 are arranged opposite to each other. The display module 01 further includes a first conductive adhesive 40. The first conductive adhesive 40 extends from the second surface 22B of the tongue 22 to the second grounding region 32 of the printed circuit board 30. The second grounding region 32 is electrically connected to the second surface 22B of the tongue 22.

That is, the second grounding region 32 of the printed circuit board 30 may be electrically connected to the second surface 22B of the tongue 22 via the first conductive adhesive 40. The static electricity on the printed circuit board 30 may be discharged by the second grounding region 32, the first conductive adhesive 40 and the second surface 22B of the tongue 22. In some embodiments, the first conductive adhesive 40 wraps the printed circuit board 30 and the tongue 22.

It should be noted that the first conductive adhesive 40 further includes a bonding function.

In some embodiments, the first grounding region 31 of the printed circuit board 30 on the side adjacent to the tongue 22 is electrically connected to the first surface 22A of the tongue 22 on the side adjacent to the printed circuit board 30, and the second grounding region 32 of the printed circuit board 30 on the side away from the tongue 22 and the second surface 22B of the tongue 22 on the side away from the printed circuit board 30 are bonded by the first conductive adhesive 40. In this way, both the first grounding region 31 and the second grounding region 32 of the printed circuit board 30 are well grounded, and the first conductive adhesive 40 may fix the printed circuit board 30 and the tongue 22 to each other by turning up. Therefore, the number of the electrostatic discharge paths of the printed circuit board 30 is increased, and the stability of the fixing between the printed circuit board 30 and the tongue 22 is increased, thereby making the grounding impedance of the printed circuit board 30 meet requirements and ensuring the stability of the fixing between the printed circuit board 30 and the tongue 22.

In addition, the first conductive adhesive 40 does not occupy much space, and thus an avoiding space reserved for subsequent assembling process is small, thereby reducing the thickness of the display apparatus including the display module 01.

In some embodiments of the present disclosure, as shown in FIG. 2, the first grounding region 31 of the printed circuit board 30 and the first surface 22A of the tongue 22 are electrically connected by being in contact with each other.

Due to the turning-up fixing effect of the first conductive adhesive 40, the first grounding region 31 of the printed circuit board 30 and the first surface 22A of the tongue 22 may be in close and tight contact. The electrical connection between the first grounding region 31 of the printed circuit board 30 and the first surface 22A of the tongue 22 in contact manner ensures a better conductive effect between the first grounding region 31 and the first surface 22A, thereby making the grounding impedance of the printed circuit board 30 meet requirements.

In some embodiments, no other connection material is arranged between the first grounding region 31 of the printed circuit board 30 and the first surface 22A of the tongue 22, thereby reducing material and cost for manufacturing the display module 01.

In some embodiments, the first grounding region 31 of the printed circuit board 30 and the first surface 22A of the tongue 22 are electrically connected by soldering.

In some embodiments, the first grounding region 31 of the printed circuit board 30 and the first surface 22A of the tongue 22 are fixed more securely by the soldering process. By ensuring the effective electrical connection between the first grounding region 31 and the first surface 22A of the tongue 22, the fixing between the printed circuit board 30 and the tongue 22 is more stable.

Figure 3:
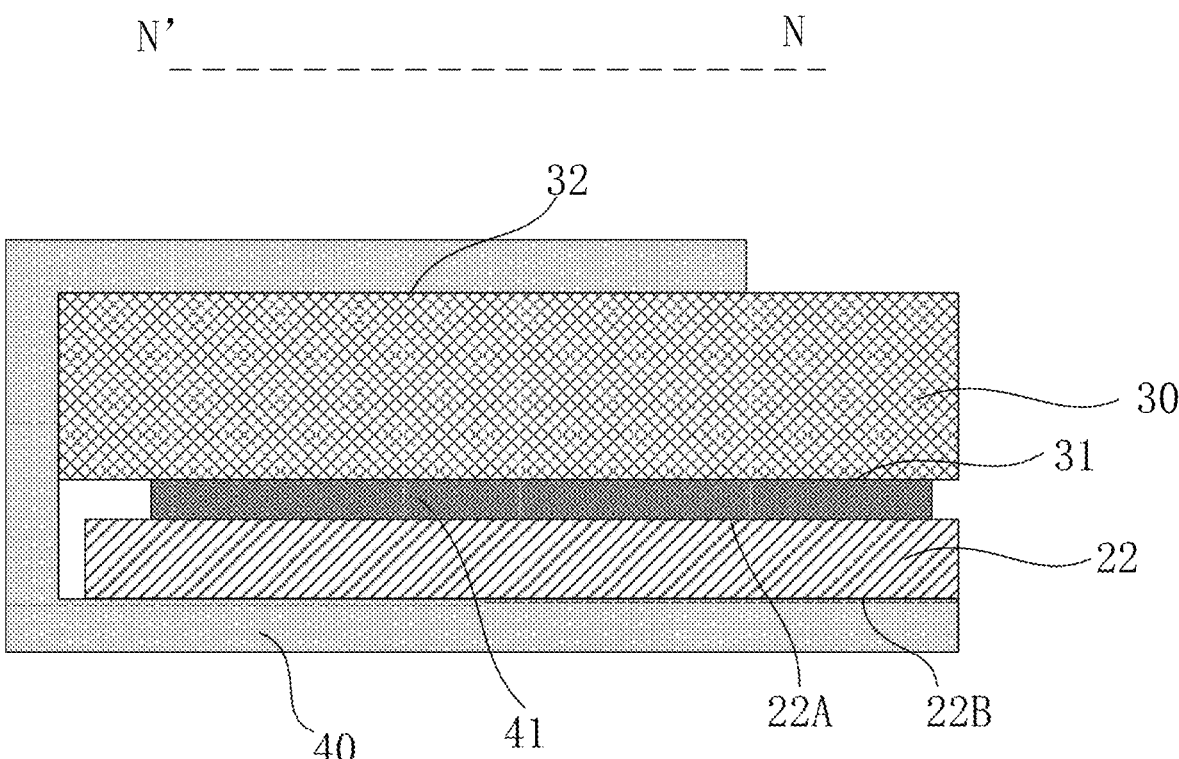
FIG. 3 is another cross-sectional view of a display module taken along line NN' in FIG. 1 according to some embodiments of the present disclosure.

FIG. 3 is another cross-sectional view of a display module taken along line NN' in FIG. 1 according to some embodiments of the present disclosure.

As shown in FIG. 3, in some embodiments of the present disclosure, the display module 01 further includes a second conductive adhesive 41. The second conductive adhesive 41 is between the first grounding region 31 of the printed circuit board 30 and the first surface 22A of the tongue 22.

That is, the grounding region 31 of the printed circuit board 30 and the first surface 22A of the tongue 22 are electrically connected by the second conductive adhesive 41.

In the embodiments of the present disclosure, in addition to electrically connecting the first grounding region 31 of the printed circuit board 30 and the first surface 22A of the tongue 22, the second conductive adhesive 41 bonds and fixes the first grounding region 31 of the printed circuit board 30 and the first surface 22A of the tongue 22 with each other. On the one hand, the fixing effect between the printed circuit board 30 and the tongue 22 is further improved. On the other hand, the electrical connection effect between the first grounding region 31 of the printed circuit board 30 and the tongue 22 is further improved, and the grounding impedance of the first grounding region 31 of the printed circuit board 30 is reduced, thereby further ensuring that the grounding impedance of the printed circuit board 30 meets the requirements.

In some embodiments, as shown in FIG. 1 and FIG. 2, the printed circuit board 30 includes a first side surface 30A. The first side surface 30A is located on a side of the printed circuit board 30 away from the display panel 10. The first side surface 30A is provided with a third grounding region 33. The first conductive adhesive 40 is electrically connected to the third grounding region 33.

In some embodiments, the first conductive adhesive 40 extends from the first grounding region 31 to the second surface 22B of the tongue 22 along the third grounding region 31 in the first side surface 30A.

In some embodiments, the third grounding region 31 of the printed circuit board 30 may be electrically connected to the second surface 22B of the tongue 22 via the first conductive adhesive 40, so the static electricity on the printed circuit board 30 may be discharged through the third grounding region 33, the first conductive adhesive 40, and the second surface 22B of the tongue 22. In this way, an electrostatic discharge path is added for the printed circuit board 30, thereby further reducing the grounding impedance of the printed circuit board 30.

Figure 4:
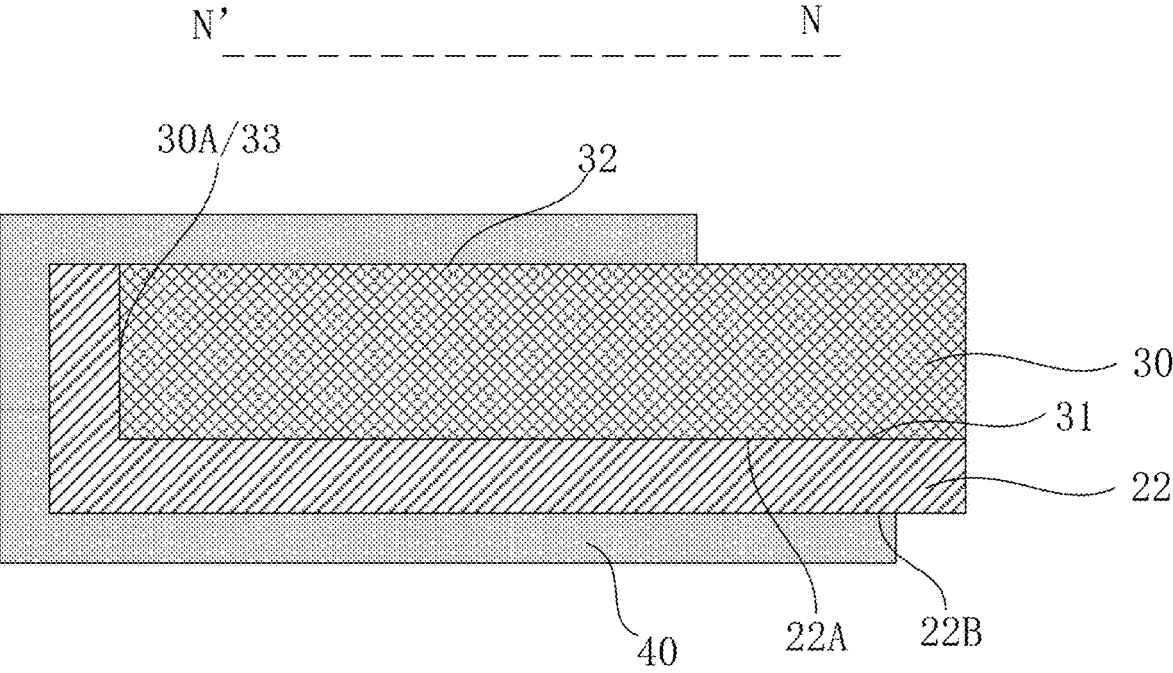
FIG. 4 is another cross-sectional view of a display module taken along line NN' in FIG. 1 according to some embodiments of the present disclosure.
Figure 5:
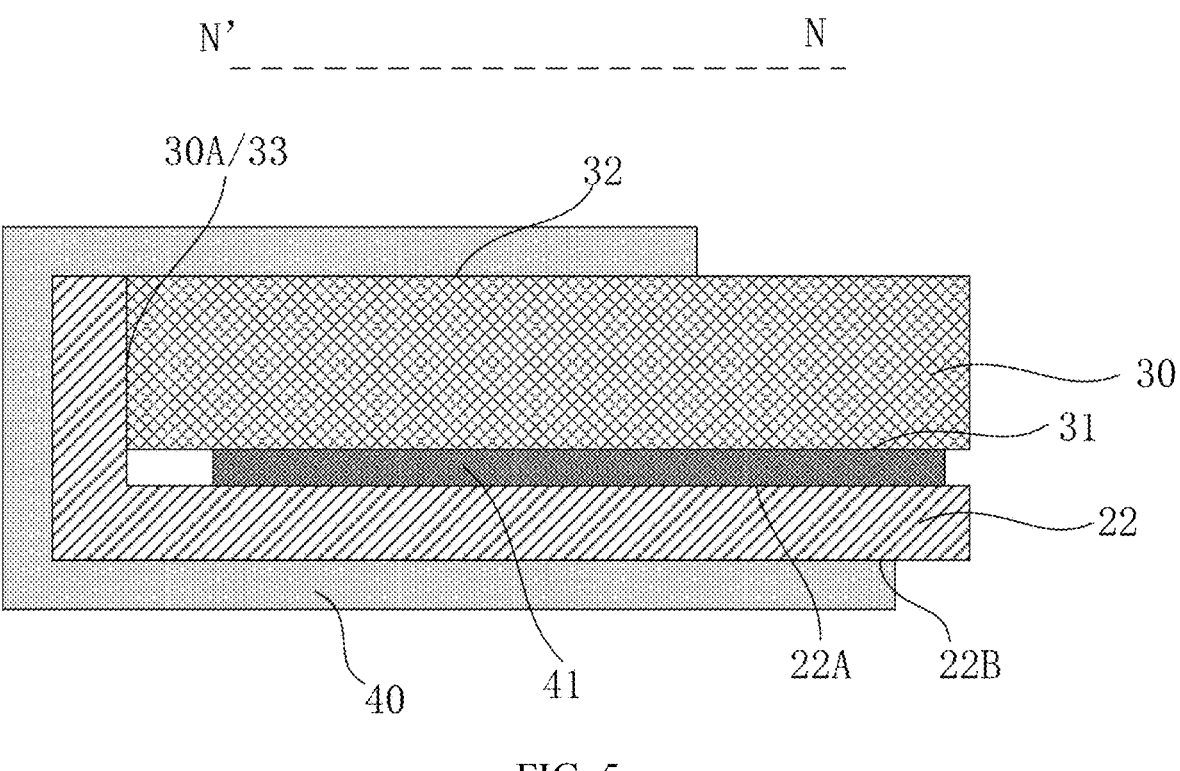
FIG. 5 is another cross-sectional view of a display module taken along line NN' in FIG. 1 according to some embodiments of the present disclosure.

FIG. 4 is another cross-sectional view of a display module taken along line NN' in FIG. 1 according to some embodiments of the present disclosure. FIG. 5 is another cross-sectional view of a display module taken along line NN' in FIG. 1 according to some embodiments of the present disclosure.

In some embodiments, as shown in FIG. 4, the tongue 22 extends from the first grounding region 31 of the printed circuit board 30 to the first side surface 30A of the printed circuit board 30.

That is, the tongue 22 may be bent, and the tongue 22 not only supports the first grounding region 31 of the printed circuit board 30 but also at least partially shields the first side surface 30A of the printed circuit board 30.

In some embodiments of the present disclosure, the tongue 22 extends from the first grounding region 31 of the printed circuit board 30 to the first side surface 30A of the printed circuit board 30. When arranging the first conductive adhesive 40, the first conductive adhesive 40 may extend to the second grounding region 32 of the printed circuit board 30 via the second surface 22B of the tongue 22 and a surface of the tongue 22 away from the first side surface 30A of the printed circuit board 30, which increases the contact area between the second grounding region 32 and the tongue 22, thereby improving the grounding effect of the second grounding region 32 and reducing the grounding impedance of the printed circuit board 30.

In some embodiments, as shown in FIG. 4, the tongue 22 is in contact with and electrically connected to the first grounding region 31 of the printed circuit board 30, and is also in contact with and electrically connected to the first side surface 30A of the printed circuit board 30.

In some embodiments, as shown in FIG. 5, the tongue 22 is electrically connected to the first grounding region 31 of the printed circuit board 30 by the second conductive adhesive 41, and is electrically connected to the first side surface 30A of the printed circuit board 30 through direct contact.

In some embodiments, the tongue 22 is electrically connected to the first grounding region 31 of the printed circuit board 30 by soldering, and is electrically connected to the first side surface 30A of the printed circuit board 30 through direct contact.

Furthermore, as shown in FIG. 4 and FIG. 5, the tongue 22 is in contact with and electrically connected to the third grounding region 33 in the first side surface 30A of the printed circuit board 30. In this way, the area of the grounding region of the printed circuit board 30 is increased, the grounding effect of the printed circuit board 30 is improved, and the risk that the printed circuit board 30 is damaged by static electricity is reduced.

It should be noted that, in some other embodiments, the tongue 22 and the first side surface 30A of the printed circuit board 30 may be electrically connected by soldering or conductive adhesive.

In some embodiments of the present disclosure, as shown in FIG. 1, the tongue 22 has a width W1 in a first direction X, and the first conductive adhesive 40 has a width W2 in the first direction X, where W1=W2. The first direction X intersects an extension direction Y of the tongue 22.

It should be noted that, in addition to the grounding regions, the printed circuit board 30 further includes a wiring region. The wiring region is insulated from the grounding regions and the tongue.

In some embodiments, the first conductive adhesive 40 and the tongue 22 have a width that is substantially the same in the first direction X. Therefore, in the first direction X, the first conductive adhesive 40 does not protrude from the tongue 22. In addition to ensuring an enough adhesion area between the first conductive adhesive 40 and the tongue 22, it is avoided that the first conductive adhesive 40 is adhered with the wiring region of the printed circuit board 30, thereby preventing the first conductive adhesive 40 from affecting the normal operation of the wiring region.

It should be noted that, in some other embodiments, the width of the first conductive adhesive 40 in the first direction X may be slightly smaller than the width of the tongue 22 in the first direction X.

Figure 6:
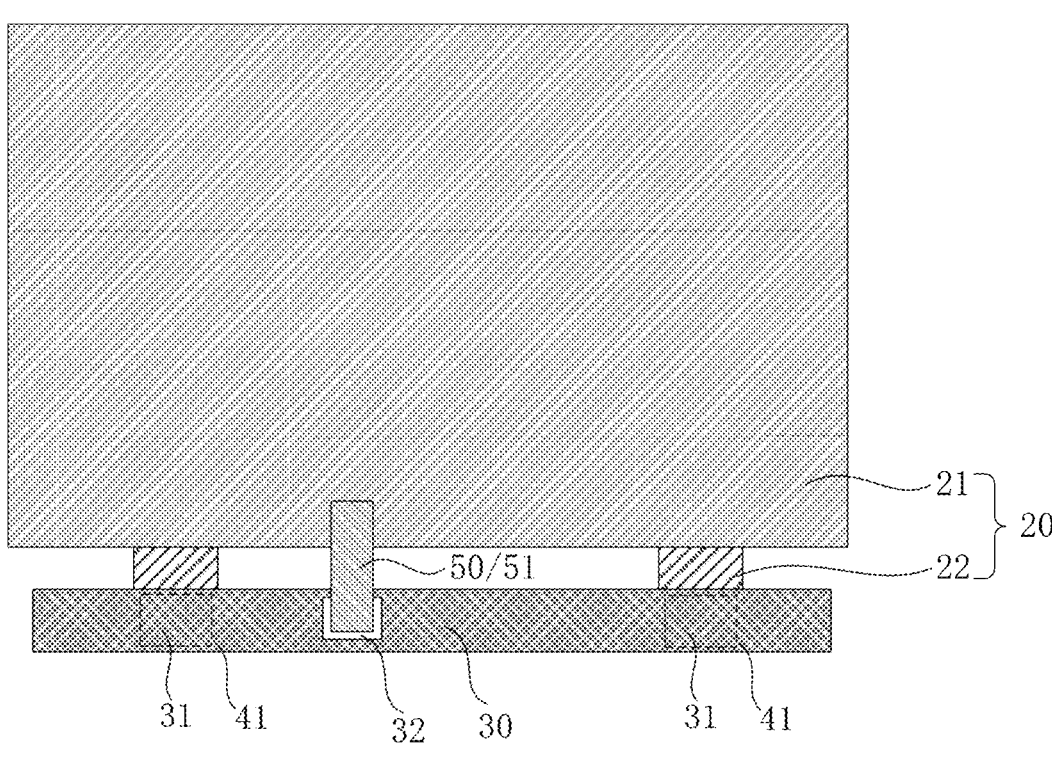
FIG. 6 is a plan view of another display module according to some embodiments of the present disclosure.
Figure 7:
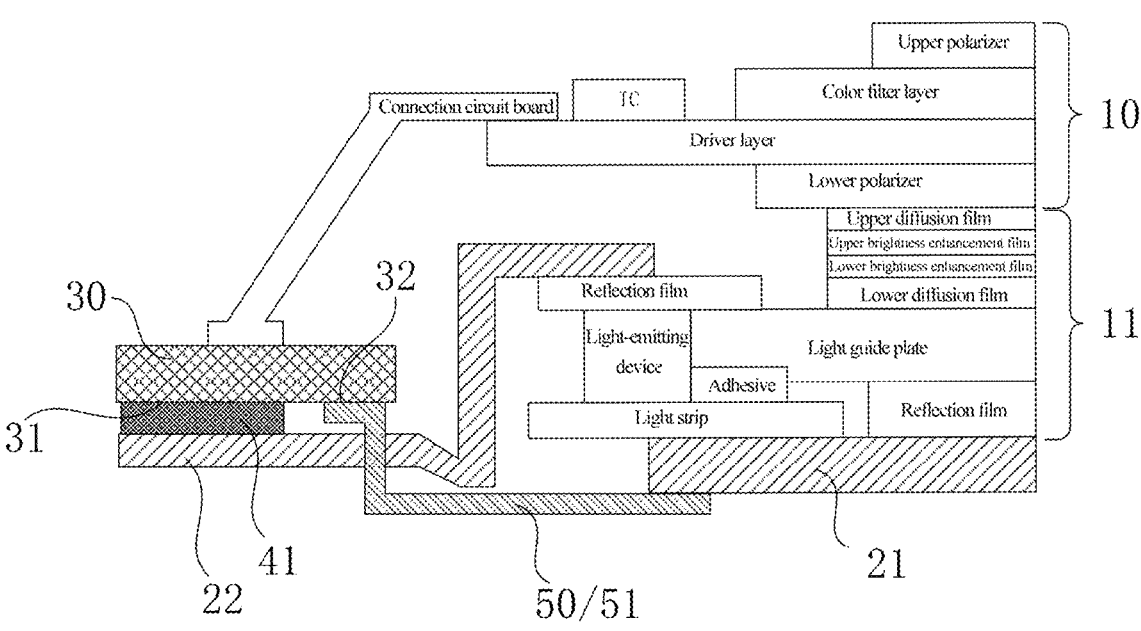
FIG. 7 is a schematic diagram showing structure of a related display module of the present disclosure.

FIG. 6 is a plan view of another display module according to some embodiments of the present disclosure. FIG. 7 is a schematic diagram showing structure of a related display module of the present disclosure.

In some embodiments, as shown in FIG. 6 and FIG. 7, the second grounding region 32 is located on a side where the first grounding region 31 is located. The display module 01 further includes a grounding component 50. A first end of the grounding component 50 is fixedly and electrically connected to the second grounding region 32, and a second end of the grounding component 50 is electrically connected to the second surface 22B of the tongue 22 or the body 21 of the backplane 20. The figure merely shows the electrical connection between the grounding component and the body of the backplane.

In some embodiments, the grounding component 50 may be fixedly and electrically connected to the second grounding region 32 by a soldering process. Certainly, the second end of the grounding component 50 may be fixedly and electrically connected to the second surface 22B of the tongue 22 or the body 21 of the backplane 20 by a soldering process.

In other words, the second grounding region 32 of the printed circuit board 30 may be electrically connected to the backplane 20 via the grounding component 50, and the static electricity on the printed circuit board 30 may be discharged via the second grounding region 32, the grounding component 50, and the backplane 20. In addition, the printed circuit board 30 and the backplane 20 are fixedly connected by the grounding component 50.

In some embodiments, the second grounding region 32 of the printed circuit board 30 is electrically connected to the backplane 20 via the grounding component 50, which adds an electrostatic discharge path for the printed circuit board 30 and reduces the grounding impedance of the printed circuit board 30, so that the grounding impedance of the printed circuit board 30 meets the requirements. In addition, the printed circuit board 30 and the backplane 20 are fixedly connected by the grounding component 50, thereby further improving the stability of the printed circuit board 30.

In some embodiments, as shown in FIG. 6 and FIG. 7, the grounding component 50 includes a flexible circuit board 51. A first end of the flexible circuit board 51 is fixedly and electrically connected to the second grounding region 31, and a second end of the flexible circuit board 51 is fixedly and electrically connected to the second surface 22B of the tongue 22 or the body 21 of the backplane 20.

In some embodiments, the first end of the flexible circuit board 51 is fixedly and electrically connected to the second grounding region 31 of the printed circuit board 30 by soldering.

In some embodiments, the second end of the flexible circuit board 51 is fixedly and electrically connected to the second surface 22B of the tongue 22 or the body 21 of the backplane 20 by soldering.

In this embodiment, the static electricity in the printed circuit board 30 may be discharge via the second grounding region 32, the flexible circuit board 51, and the backplane 20, which adds an electrostatic discharge path for the printed circuit board 30. In addition, the first end and the second end of the flexible circuit board 51 are electrically connected to corresponding elements in a fixing manner, so the electrostatic discharge path of the printed circuit board 30 via the flexible circuit board 51 has a better conductive effect, thereby further ensuring that the grounding impedance of the printed circuit board 30 meets requirements.

In addition, the flexible circuit board 51 does not occupy a large space, and thus an unused space reserved for subsequent assembly process is correspondingly small, thereby reducing the thickness of the display apparatus including the display module 01.

Figure 8:
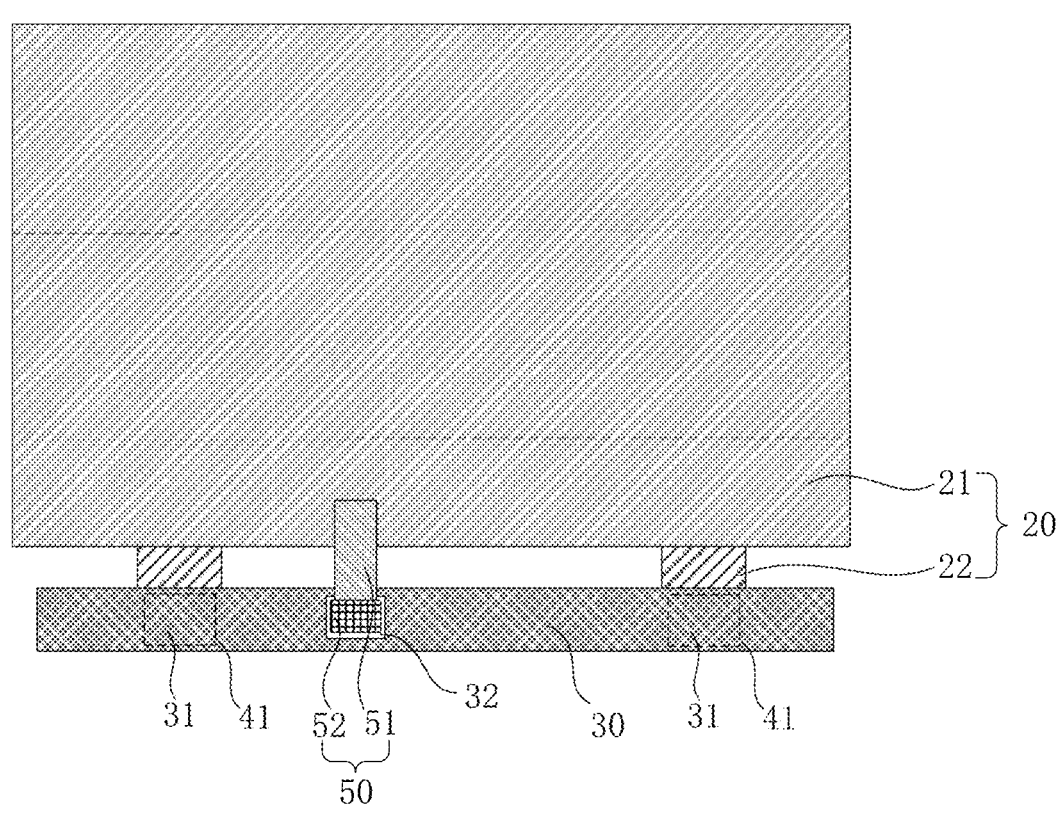
FIG. 8 is a plan view of another display module according to some embodiments of the present disclosure.
Figure 9:
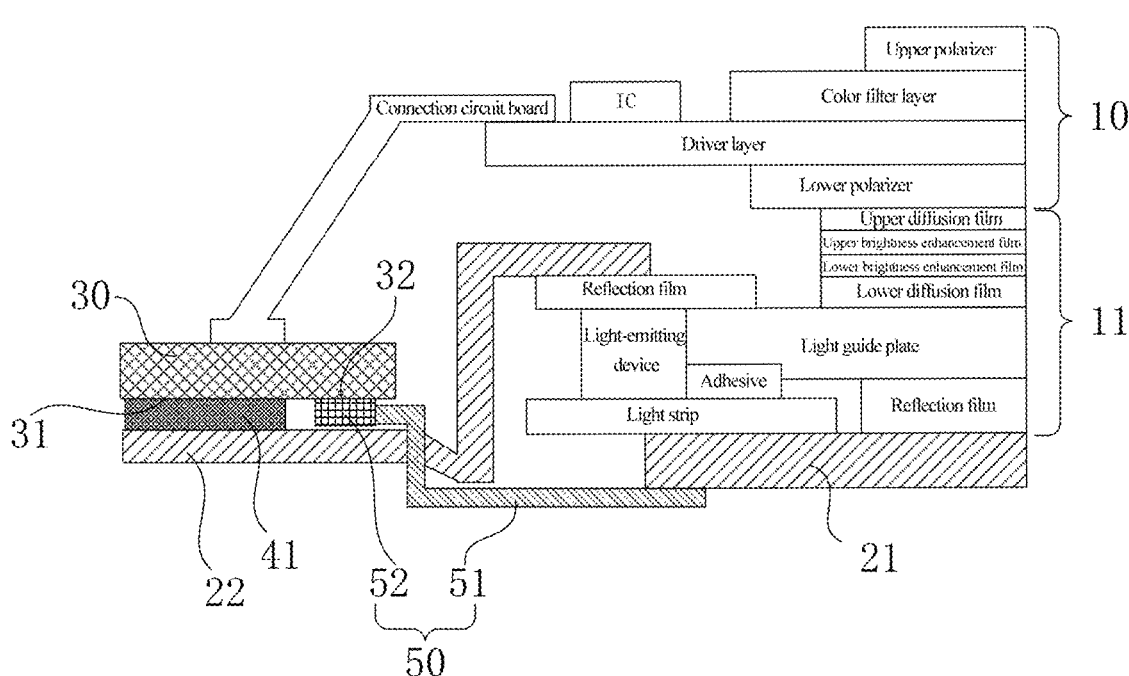
FIG. 9 is a schematic diagram showing structure of another related display module of the present disclosure.

FIG. 8 is a plan view of another display module according to some embodiments of the present disclosure. FIG. 9 is a schematic diagram showing structure of another related display module of the present disclosure.

In some embodiments of the present disclosure, as shown in FIG. 8 and FIG. 9, the grounding component 50 further includes a connector 52. The connector 52 is fixed to the second grounding region 32 and electrically connected to the second grounding region 32. The first end of the flexible circuit board 51 is electrically connected to the connector 52 by docking. That is, the first end of the flexible circuit board 51 may be electrically connected to the second grounding region 32 via the connector 52. Certainly, the flexible circuit board 51 may be connected to and disconnected from the connector 52 by plugging or unplugging.

In some embodiments, the connector 52 and the second grounding region 32 may be fixedly and electrically connected by soldering. Therefore, the reliability of the connection between the connector 52 and the second grounding region 32 is improved, and thus the reliability of the connection between the flexible circuit board 51 and the second grounding region 32 via the connector 52 is improved.

Certainly, the second end of the flexible circuit board 51 may be electrically connected to the second surface 22B of the tongue 22 or the body 21 of the backplane 20 by soldering.

In addition, the body 21 of the backplane 20 may be soldered with a connector, and the second end of the flexible circuit board 51 may be electrically connected to the connector on the body 21 by docking.

In the above embodiments, the flexible circuit board 51 may be connected to and disconnected from the connector 52 by plugging or unplugging, thereby realizing the connection and disconnection between the flexible circuit board 51 and the second grounding region 32 of the printed circuit board 30. The reliability of the electrostatic discharge path of the printed circuit board 30 via the flexible circuit board 51 is improved, and the dismounting and change of the printed circuit board 30 are convenient.

In some embodiments, as shown in FIG. 6 to FIG. 9, the first grounding region 31 of the printed circuit board 30 may be electrically connected to the first surface 22A of the tongue 22 by the second conductive adhesive 41. Certainly, the first grounding region 31 may be electrically connected to the first surface 22A of the tongue 22 by soldering or direct contact. In this case, the connection point between the grounding component 50 and the backplane 20 may be located in the second surface 22B of the tongue 22 or on the body 21 of the backplane 20.

It should be noted that, as shown in FIG. 7 and FIG. 9, the display module 01 further includes a backlight module 11 for providing light for the display panel 10. The backlight module 11 includes a light strip and a light-emitting device arranged on the light strip. In some embodiments, the backlight module 11 further includes a reflection film, a light guide plate, a lower diffusion film, a lower brightness enhancement film, an upper brightness enhancement film, and an upper diffusion film, which are stacked. The light strip is connected to the light guide plate by an adhesive. The display panel 10 may include a lower polarizer, a driver layer, a color filter layer, an upper polarizer, and an integrated circuit (IC). Certainly, FIG. 8 and FIG. 9 merely show an example structure of the backlight module 11 and the display panel 10. In other embodiments, the backlight module 11 and the display panel 10 may be arranged in other structures.

The display panel 10 is electrically connected to the printed circuit board 30 via a connection circuit board. For example, an end of the connection circuit board is electrically connected to the wiring region of the printed circuit board 30, and another end of the connection circuit board is electrically connected to the driver layer of the display panel 10.

The connection circuit board may be a flexible circuit board having a structure different from the flexible circuit board 51 in the grounding component 50.

Figure 10:
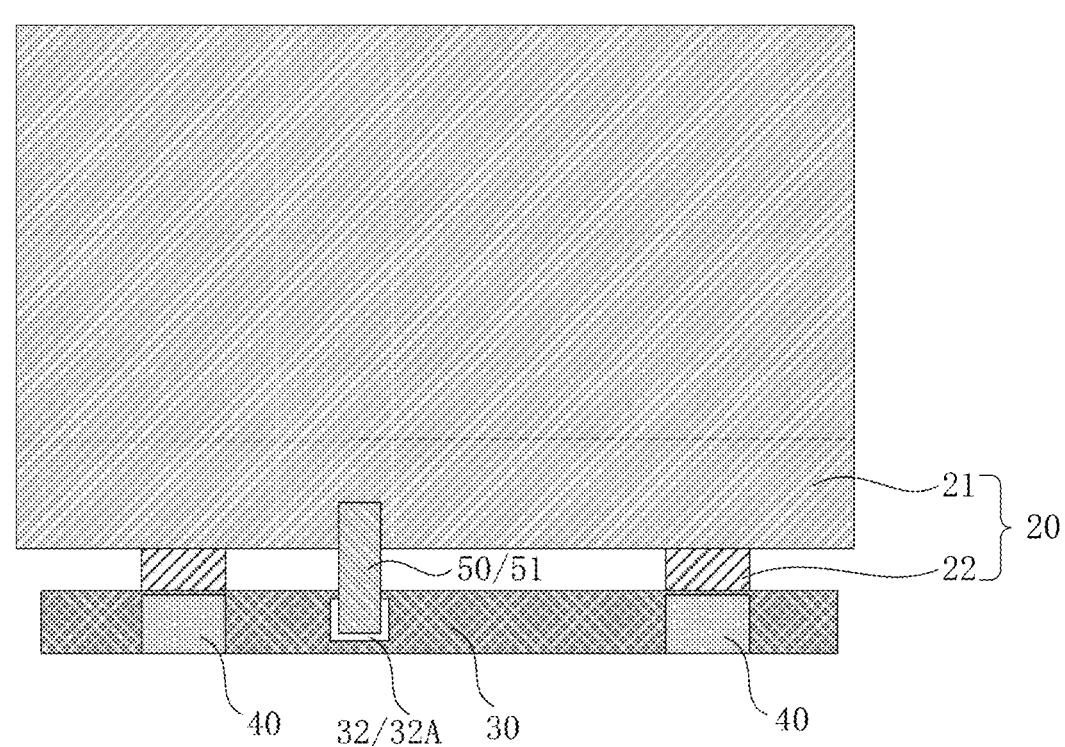
FIG. 10 is a plan view of another display module according to some embodiments of the present disclosure.
Figure 11:
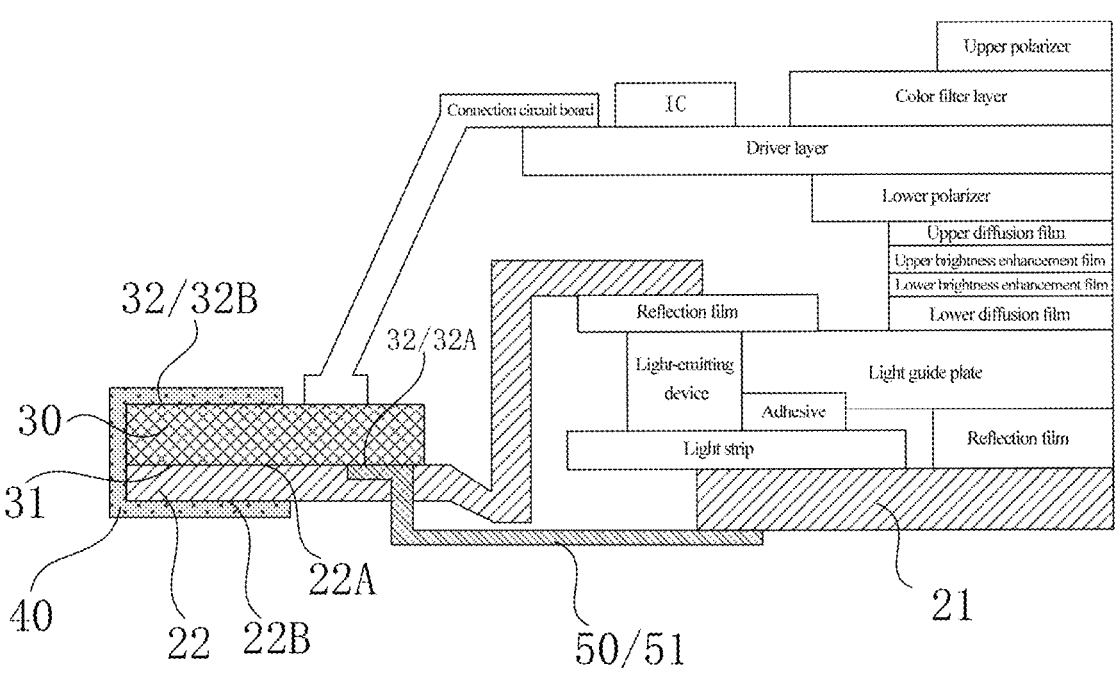
FIG. 11 is a schematic diagram showing structure of another related display module of the present disclosure.

FIG. 10 is a plan view of another display module according to some embodiments of the present disclosure. FIG. 11 is a schematic diagram showing structure of another related display module of the present disclosure.

In some embodiments, the printed circuit board 30 may include a plurality of second grounding regions 32. One or more of the plurality of second grounding regions 32 are provided on a side where the first grounding region 31 is located, and another one or more of the plurality of second grounding regions 32 are provided on a side of the printed circuit board 30 away from the tongue 22. That is, one or more second grounding regions 32 are provided on a surface of the printed circuit board 30 adjacent to the tongue 22, and another one or more second grounding regions 32 are provided on a surface of the printed circuit board 30 away from the tongue 22.

For ease of description, the second grounding region 32 provided on the surface of the printed circuit board 30 adjacent to the tongue 22 may be referred to as a first-type second grounding region 32A, and the second grounding region 32 provided on the surface of the printed circuit board 30 away from the tongue 22 may be referred to as a second-type second grounding region 32B.

As shown in FIG. 10 and FIG. 11, the display module 01 further includes the first conductive adhesive 40 and the flexible circuit board 51. The first conductive adhesive 40 extends from the second surface 22B of the tongue 22 to the second-type second grounding region 32B of the printed circuit board 30, and the second-type second grounding region 32B is electrically connected to the second surface 22B of the tongue 22 via the first conductive adhesive 40. The static electricity on the printed circuit board 30 may be discharged via the second-type second grounding region 32B, the first conductive adhesive 40, and the second surface 22B of the tongue 22.

The first end of the flexible circuit board 51 is fixedly and electrically connected to the first-type second grounding region 32A, and the second end of the flexible circuit board 51 is fixedly and electrically connected to the body 21 of the backplane 20. The static electricity on the printed circuit board 30 may be discharged via the first-type second grounding region 32A, the flexible circuit board 51, and the body 21 of the backplane 20.

Certainly, the first grounding region 31 of the printed circuit board 30 is further electrically connected to the first surface 22A of the tongue 22, and the static electricity on the printed circuit board 30 may be discharged via the first grounding region 31 and the tongue 22. The first grounding region 31 and the first surface 22A of the tongue 22 may be electrically connected by direct contact, or by a soldering process, or by a conductive adhesive.

In some embodiments of the present disclosure, the static electricity on the printed circuit board 30 is discharged by the first grounding region 31, the first-type second grounding region 32A, and the second-type second grounding region 32B, which increases the number of the electrostatic discharge paths of the printed circuit board 30, thereby further improving the grounding effect of the printed circuit board 30 and reducing the grounding impedance of the printed circuit board 30. In addition, the first conductive adhesive 40 may fix the printed circuit board 30 and the tongue 22 to each other by turning up the printed circuit board 30 and the tongue 22, and the flexible circuit board 51 may fix the printed circuit board 30 and the body 21 of the backplane 20 to each other, thereby further improving the fixing stability of the printed circuit board 30.

Figure 12:
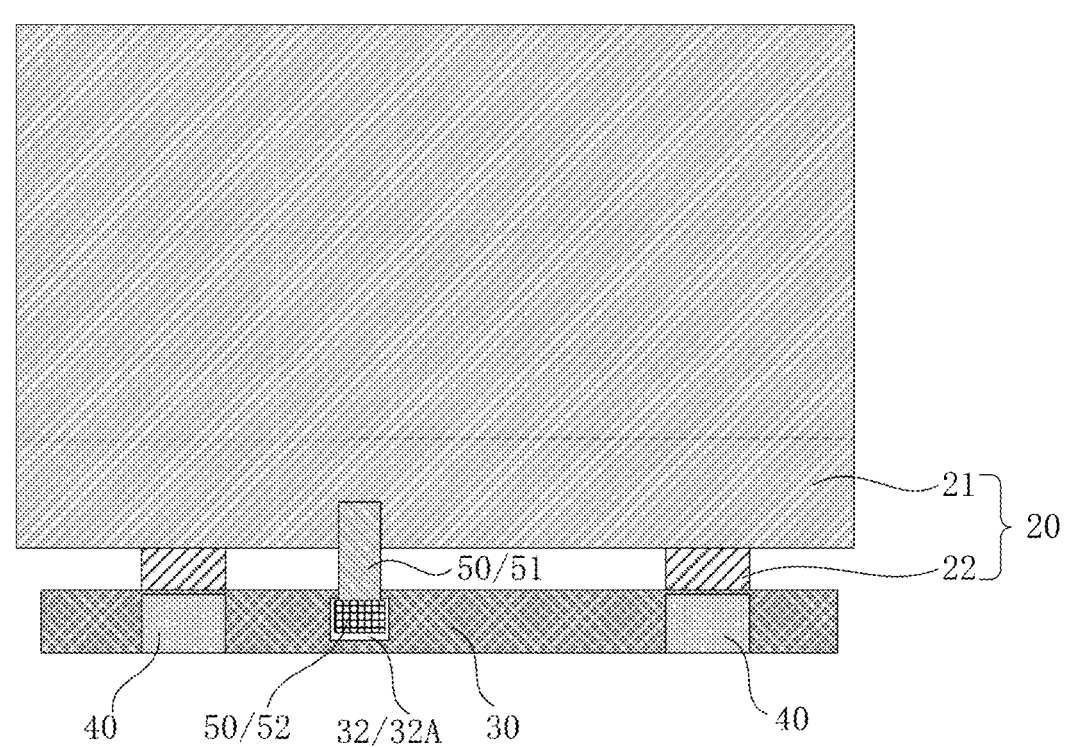
FIG. 12 is a plan view of another display module according to some embodiments of the present disclosure.
Figure 13:
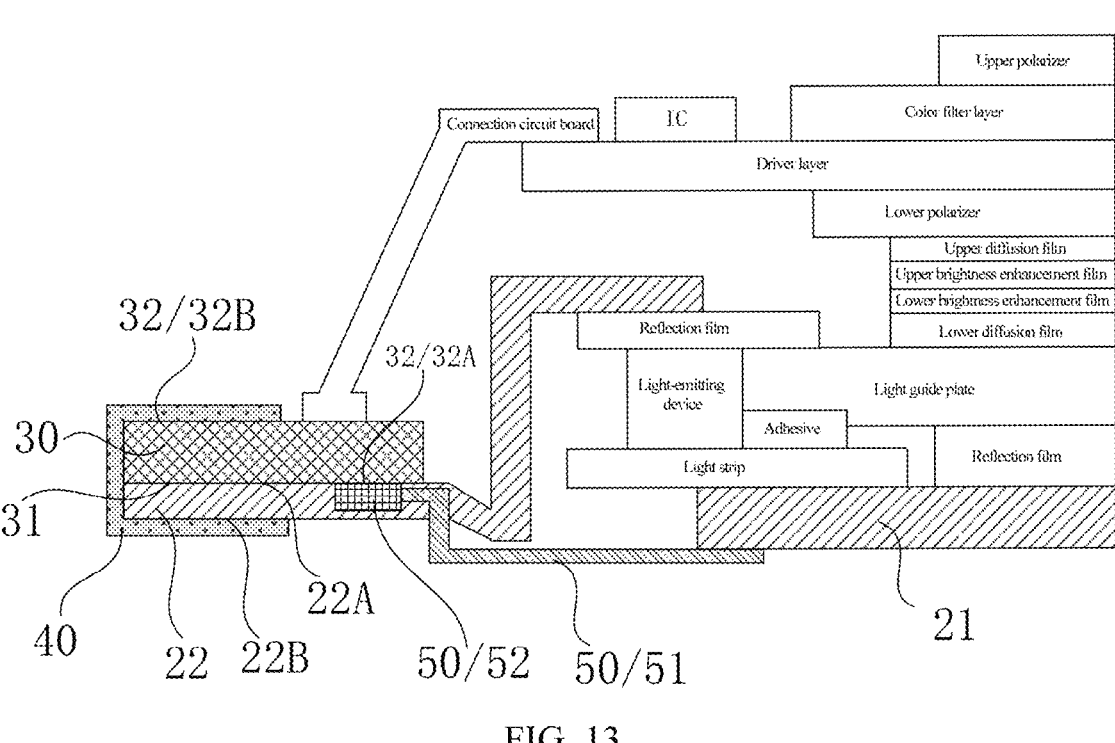
FIG. 13 is a schematic diagram showing structure of another related display module of the present disclosure.

FIG. 12 is a plan view of another display module according to some embodiments of the present disclosure. FIG. 13 is a schematic diagram showing structure of another related display module of the present disclosure.

The display module 01 shown in FIG. 12 and FIG. 13 and the display module 01 shown in FIG. 10 and FIG. 11 have the following difference. The display module 01 shown in FIG. 12 and FIG. 13 further includes the connector 52. The connector 52 is fixedly and electrically connected to the first-type second grounding region 32A. The first end of the flexible circuit board 51 is electrically connected to the connector 52 by docking. In this way, the flexible circuit board 51 is electrically connected to the first-type second grounding region 32A.

Figure 14:
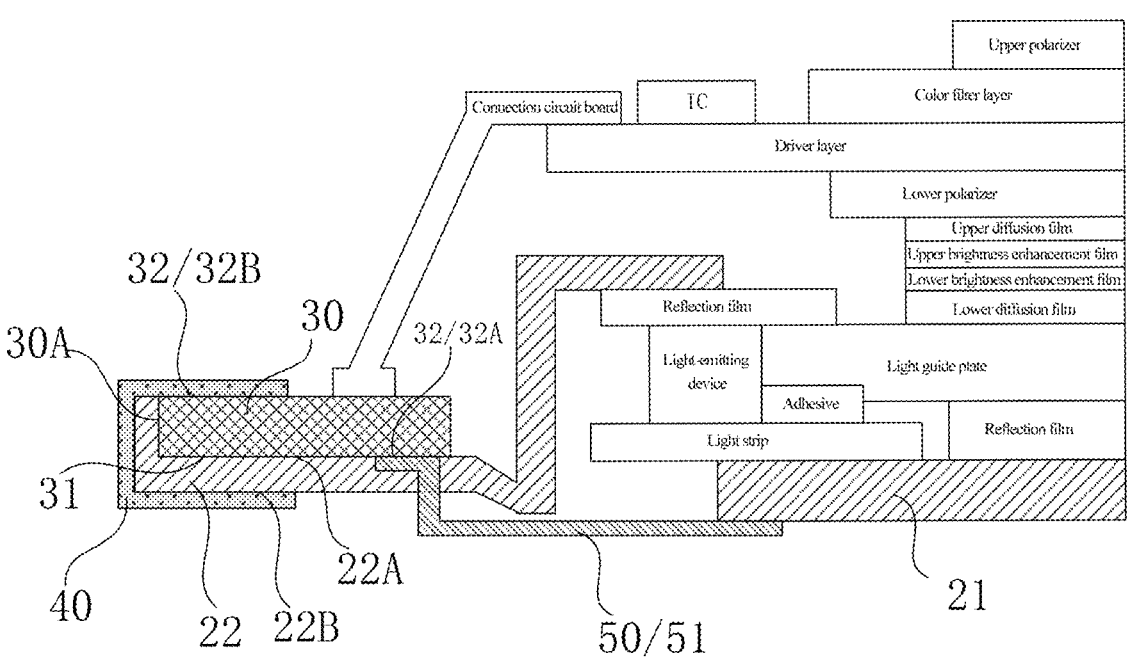
FIG. 14 is a schematic diagram showing structure of another related display module of the present disclosure.

FIG. 14 is a schematic diagram showing structure of another related display module of the present disclosure.

The display module 01 shown in FIG. 14 and the display module 01 shown in FIG. 10 and FIG. 11 have the following difference. The tongue 22 in the display module 01 shown in FIG. 14 extends from the first grounding region 31 of the printed circuit board 30 to the first side surface 30A of the printed circuit board 30. That is, the tongue 22 is bent. In this way, the contact area between the first conductive adhesive 40 and the tongue 22 is increased, thereby further reducing the grounding impedance of the printed circuit board 30.

It should be noted that in the structure diagrams of the display module 01 shown in FIG. 7, FIG. 9, FIG. 11, FIG. 13, and FIG. 14, in order to reflect both the position of the first grounding region 31 and the position of the second grounding region 32, the second grounding region 32 connected to the flexible circuit board 51 is placed at a position overlapping with the tongue 22 (in a thickness direction of the tongue 22). However, in an actual product, in the thickness direction of the tongue 22, the second grounding region 32 connected to the flexible circuit board 51 may not overlap with the tongue 22.

Compared with a conventional display module, the display module 01 provided by embodiments of the present disclosure can ensure that the grounding impedance of the printed circuit board 30 meets the requirements, and does not need to provide a large avoiding space for subsequent assembling. As described in the above embodiments, in order to make the grounding impedance of the printed circuit board 30 meet the requirements, the present disclosure provides multiple methods. In practical application, a suitable method may be flexibly selected according to needs. In addition, the display module 01 provided by embodiments of the present disclosure may be a liquid crystal display module. Certainly, the display module 01 may be any kind of display module including the backplane 20 and the printed circuit board 30.

Figure 15:
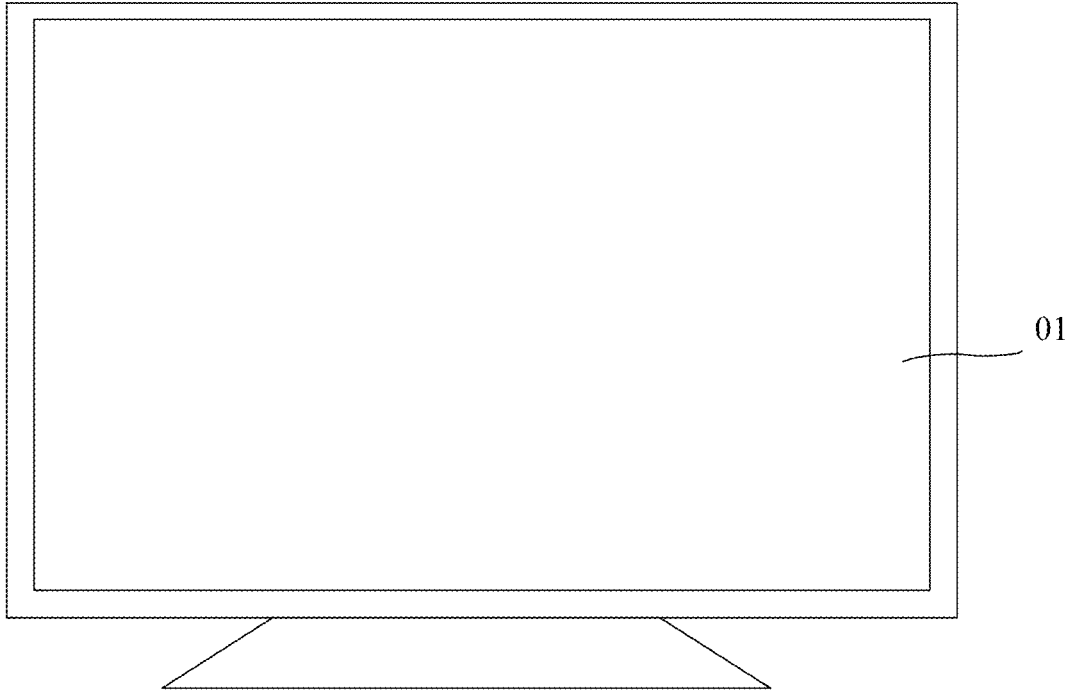
FIG. 15 is a schematic diagram of a display apparatus according to some embodiments of the present disclosure.

FIG. 15 is a schematic diagram of a display apparatus according to some embodiments of the present disclosure.

Embodiments of the present disclosure further provide a display apparatus 02. The display apparatus 02 includes the display module 01 in the above embodiments. For example, the display apparatus 02 may be an electronic device such as a mobile phone, a computer, a television, a vehicle-mounted display device, and the like, which is not limited by the present disclosure.

In the display apparatus 02, the first grounding region 31 of the printed circuit board 30 is electrically connected to the first surface 22A of the tongue 22, and the second grounding region 32 of the printed circuit board 30 is electrically connected to the second surface 22B of the tongue 22 and/or the body 21 of the backplane 20. In this way, the first grounding region 31 of the printed circuit board 30 and the first surface 22A of the tongue 22 may form a conductive path for electrostatic discharge, and the second grounding region 32 of the printed circuit board 30 and the second surface 22B of the tongue 22 and/or the body 21 of the backplane 20 may form another conductive path for electrostatic discharge. Therefore, the number of fixing points of the printed circuit board 30 is increased, and the number of electrostatic discharge paths of the printed circuit board 30 is also increased, thereby reducing a grounding impedance of the printed circuit board 30. Accordingly, the fixing of the printed circuit board 30 is improved, and the grounding impedance of the printed circuit board 30 meets requirements.

The above are merely exemplary embodiments of the present disclosure, and are not intended to limit the present disclosure. For those skilled in the art, the present disclosure may be subject to various modifications and changes. Any modification, equivalent replacement, improvement and the like within the spirit and principle of the present disclosure all fall within the protection scope of the present disclosure.

What is claimed is:

1. A display module, comprising:
a display panel;
a backplane; and
a printed circuit board,
wherein the printed circuit board is electrically connected to the display panel, the backplane comprises a body and a tongue protruding from the body, and the printed circuit board is fixed to the tongue,
wherein the printed circuit board comprises a first grounding region and a second grounding region, the first grounding region is located on a side of the printed circuit board adjacent to the tongue, the tongue comprises a first surface and a second surface opposite to the first surface, the first surface faces a side of the printed circuit board, and the first grounding region is electrically connected to the first surface of the tongue, and
wherein the second grounding region is electrically connected to at least one of the second surface of the tongue and the body of the backplane.

2. The display module according to claim 1, further comprising a first conductive adhesive extending from the second surface of the tongue to the second grounding region of the printed circuit board, wherein the second grounding region is located on a side of the printed circuit board away from the tongue, and electrically connected to the second surface of the tongue.

3. The display module according to claim 2, wherein the first grounding region of the printed circuit board is electrically connected to the first surface of the tongue.

4. The display module according to claim 2, wherein the first grounding region of the printed circuit board is electrically connected to the first surface of the tongue by soldering.

5. The display module according to claim 2, further comprising a second conductive adhesive located between the first grounding region of the printed circuit board and the first surface of the tongue.

6. The display module according to claim 2, wherein the printed circuit board comprises a first side surface located on a side of the printed circuit board away from the display panel and a third grounding region provided in the first side surface, and wherein the first conductive adhesive is electrically connected to the third grounding region.

7. The display module according to claim 6, wherein the tongue extends from the first grounding region of the printed circuit board to the first side surface of the printed circuit board.

8. The display module according to claim 2, wherein the tongue has a width W1 in a first direction that intersects an extension direction of the tongue, the first conductive adhesive has a width W2 in the first direction, and W1=W2.

9. The display module according to claim 1, further comprising a grounding component, wherein a first end of the grounding component is fixedly and electrically connected to the second grounding region, a second end of the grounding component is fixedly and electrically connected to the second surface of the tongue or the body of the backplane, and the second grounding region is located on a side where the first grounding region is located.

10. The display module according to claim 9, wherein the grounding component comprises a flexible circuit board, a first end of the flexible circuit board is fixedly and electrically connected to the second grounding region, and wherein a second end of the flexible circuit board is fixedly and electrically connected to the second surface of the tongue or the body of the backplane.

11. The display module according to claim 10, wherein the second end of the flexible circuit board is electrically connected to the second surface of the tongue or the body of the backplane by soldering.

12. The display module according to claim 11, wherein the first end of the flexible circuit board is electrically connected to the second grounding region by soldering.

13. The display module according to claim 11, wherein the grounding component further comprises a connector fixed to the second grounding region, and wherein the first end of the flexible circuit board is electrically connected to the connector by docking.

14. The display module according to claim 13, wherein the connector is fixedly and electrically connected to the second grounding region by soldering.

15. A display apparatus, comprising a display panel, wherein the display panel comprises: a display panel; a backplane; and a printed circuit board, wherein the printed circuit board is electrically connected to the display panel, the backplane comprises a body and a tongue protruding from the body, and the printed circuit board is fixed to the tongue, wherein the printed circuit board comprises a first grounding region and a second grounding region, the first grounding region is located on a side of the printed circuit board adjacent to the tongue, the tongue comprises a first surface and a second surface opposite to the first surface, the first surface faces a side of the printed circuit board, and the first grounding region is electrically connected to the first surface of the tongue, and wherein the second grounding region is electrically connected to at least one of the second surface of the tongue and the body of the backplane.

\* \* \* \* \*